United States Patent

[11] 3,586,887

[72] Inventors Aldert Van der Ziel;
Keiji Takagi, both of Minneapolis, Minn.
[21] Appl. No. 788,758
[22] Filed Jan. 3, 1969
[45] Patented June 22, 1971
[73] Assignee The Regents of the University of Minnesota Minneapolis, Minn.

[54] TETRODE FET NOISE FIGURE BY NEUTRALIZATION AND TUNING
5 Claims, 7 Drawing Figs.

[52] U.S. Cl. .......... 307/304, 307/295, 325/318, 325/475
[51] Int. Cl. .......... H04b 1/12
[50] Field of Search .......... 307/304, 251, 279, 295; 325/318, 319, 473, 475, 483, 485

[56] References Cited
UNITED STATES PATENTS

| | | | |
|---|---|---|---|
| 3,148,332 | 9/1964 | Theriault | 328/485 |
| 3,348,154 | 10/1967 | Fish et al. | 307/304 X |
| 3,348,155 | 10/1967 | von Recklinghausen | 307/304 X |
| 3,386,053 | 5/1968 | Priddy | 307/304 X |

*Primary Examiner*—John S. Heyman
*Attorney*—Burd, Braddock & Bartz

ABSTRACT: A tetrode field effect transistor capable of having an improved noise figure is shown. Circuitry is shown for neutralizing the drain-to-gate capacitance of the first half of the tetrode near cutoff frequency, and circuitry is also shown for tuning the interstage network between the first and second half of the tetrode field effect transistor.

INVENTORS
*Aldert van der Ziel*
*Keiji Takagi*

BY *Burd, Braddock & Bartz*
ATTORNEYS

INVENTORS
*Aldert van der Ziel*
*Keiji Takagi*

BY *Burd, Braddock & Bartz*
ATTORNEYS

TETRODE FET NOISE FIGURE BY NEUTRALIZATION AND TUNING

BACKGROUND OF THE INVENTION

1. Field of the Invention

This invention relates to the field of transistor structure and operation; and, more particularly, to noise reduction and tetrode field effect transistors near cutoff frequency.

2. Description of the Prior Art

Field effect transistors, often referred to as FET, are known to prior art. Basically, the FET is a variable conductance controlled by the reverse bias of the gate-channel junction. Early discussions of field effect transistors are also available, with the discussions of W. Schockley, in the proceedings of the IRE at pages 1365 through 1376, Nov. 1952, and the paper of Bockemuehl, R.R. IEEE Transactions on Electron Devices, ED—10 (1963) at pages 31—34, being illustrative.

Characteristically, a field effect transistor has a channel portion of a first type conductivity material sandwiched between a pair of layers of second type conductivity material. The channel material is provided with a source contact and a drain contact and the second type conductivity material is provided with a gate contact. Often, one of the layers of the second type conductivity material is intended to be coupled to a reference potential such as ground thereby permitting the signal to the gate terminal to control the current flow through the channel.

It is well known that the noise figure of a field effect transistor increases with increasing frequency, and that the noise figure becomes objectionably high where the frequency of operation is greater than the cut off frequency of the field effect transistor.

It is also well known that a FET becomes unstable at high frequencies because of the feed back through the capacitance $C_{do}$ between drain and gate. In the prior art this has been overcome by the so-called cascade circuit in which a common source FET circuit is connected to a common gate FET circuit so that the drain of the first FET is directly connected to the source of the second FET. This arrangement is also available in a single package as a tetrode FET. This circuit is always stable, but it has the disadvantage that the noise figure near the cut off frequency is higher than the noise figure of the single FET with neutralized capacitance $C_{do}$.

SUMMARY

This invention, then, relates to an improved field effect transistor circuit having a first source terminal, first and second gate terminals, a first drain and a second source coupled in common, a second drain terminal, and a tuning terminal coupled to the common drain and source, whereby the first drain-to-first gate capacitance can be neutralized and the first half-to-second half circuits can be tuned, thereby enhancing the high frequency noise figure for the circuit.

A primary object, then, of this invention is to provide an improved field effect transistor circuit.

Another object of this invention is to provide a field effect transistor circuit having an improved noise figure.

Yet another object of this invention is to provide an improved field effect transistor tetrode circuit with a terminal coupled to the common drain and source point, whereby the capacitance of the first drain-to-first gate can be neutralized.

Still another object of this invention is to provide a terminal coupled to the common drain and source of a tetrode field effect transistor for permitting tuning of the interstage network for providing a minimum noise figure.

Yet another object of this invention is to provide an improved field effect transistor circuit having a terminal coupled to the common drain and source point in a cascode circuit arrangement or in a tetrode field effect transistor for providing the capability of tuning the interstage network and neutralizing the capacitance of the first drain-to-first gate, thereby enhancing the high frequency noise figure for the circuit.

These and other more detailed objectives will become readily apparent and understandable when the following detailed description is considered in view of the drawings.

DESCRIPTION OF THE PREFERRED EMBODIMENTS S

Figure 1:
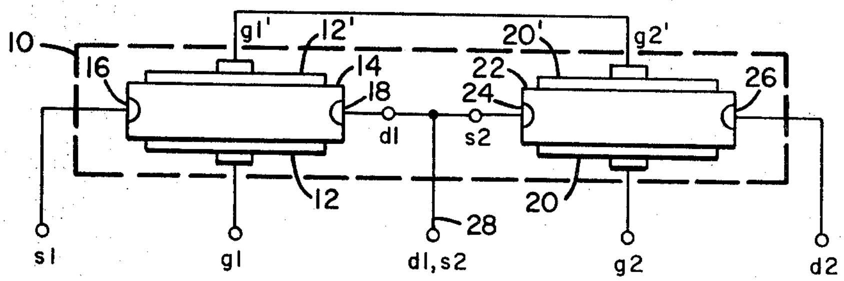
FIG. 1 is a diagrammatic view of a four terminal field effect transistor circuit arrangement having a fifth terminal coupled to a common drain source point for permitting neutralization and tuning of the circuit.

With respect to FIG. 1, it should be understood that it is intended to be only a schematic representation of the structure of this invention, and the various regions and structures shown being disproportionate to their practical sizes, for purposes of clarity and reference in the discussion.

Turning, then, to a consideration of FIG. 1, there is shown enclosed within dashed block 10 the arrangement that can be considered the equivalent of the cascode circuit and the tetrode field effect transistor circuit. The first half of the circuit is comprised of a channel portion 14 comprised of a first type conductivity material sandwiched between a pair of layers 12 and 12' of a second conductivity type material. A contact portion 16 in channel 14 is arranged for coupling to terminal s1 for coupling to a source voltage. A terminal 18 in channel 14 is arranged for coupling to terminal *d*1. A contact is coupled to layer 12 for connecting to terminal *g*1 for receiving a gate voltage. The second half of the circuit is similarly arranged with the channel material 22 being sandwiched between layers 20 and 20'. A terminal 24 is diffused in channel 22 and is referred to as coupling to terminal s2. Terminal 26 is diffused in channel 24 and is coupled to terminal d2 for coupling to the drain voltage. Layer 20 has gate terminal *g*2 associated therewith. Layers 12' and 20' are respectively associated with terminals *g*1' and *g*2', which are shown coupled in common and can be considered to be coupled to a source of reference potential, such as ground, and is often accomplished by utilizing layers 12' and 20' as the substrate for the deposition process for forming the field effect transistor portion. For the tetrode field effect transistor circuit arrangement, there would be no wire connection as shown, but instead, there would be a common substrate for the two halves of the circuit that would be referenced to the reference potential. Finally, the common point between terminals *d*1 and *s*2 is coupled by wire 28 to the terminal labeled *d*1, *s*2. The operation of this terminal will be described in more detail below.

In general operation, with the appropriate potentials applied at terminals *s*1, and *d*2, the application of a signal to *g*1 will in effect widen or narrow the current flow channel in material 14, and the application of a signal to terminal *g*2 will operate to widen or narrow the channel of conduction in channel material 22.

Having considered the basic structural arrangement of the invention, it is believed desirable at this time to direct attention to the analysis of the elements of the circuit that affect the noise figure so that the improvements made by this invention may be appreciated. In this regard, attention is directed to FIGS. 2a, 2b, and 2c, and FIG. 3. In view of the fact that tetrode field effect transistors have great appeal as high frequency amplifiers, it is necessary to give an accurate expression for their noise figure. The same treatment holds true for the FET cascode circuits. A primary problem consists in determining how much the second half of the tetrode FET contributes to the noise figure of the device. In making this determination, a second equivalent noise resistance that characterizes this contribution is introduced.

Figure 2A:
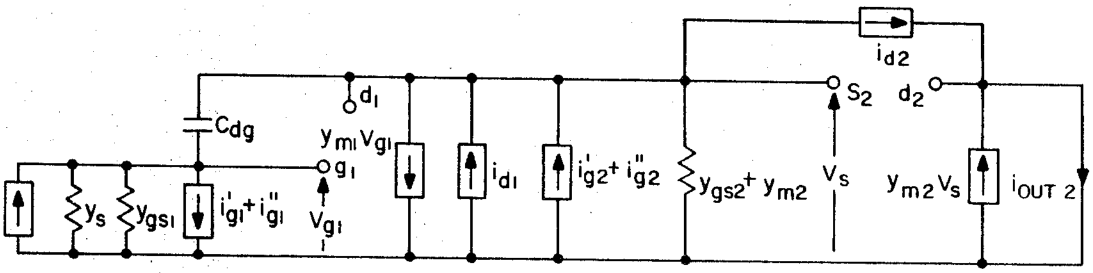
FIG. 2*a* is an equivalent circuit of a field effect transistor tetrode circuit used for noise figure measurements and calculations.
Figure 2B:
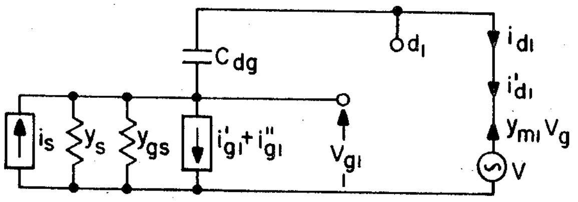
FIG. 2*b* is the equivalent circuit of the input portion of the equivalent circuit shown in FIG. 2*a;*

FIG. 2a shows the full equivalent circuit of the device of this invention. $Y_{gs1}$ and $Y_{gs2}$ are the gate-source admittances and $Y_{m1}$ and $Y_{m2}$ are the complex transfer conductances. The gate noise of the first half is split into a part $i'_{g1}$ that is fully correlated with the drain noise $i_{d1}$, and a part $i''_{g1}$ that is uncorrelated with $i_{d1}$. The same is done with the gate noise $i_{g2}$ of the second half with respect to the drain noise $i_{d2}$.

In the determination of the noise figures, the calculation goes in tow steps. In the first step, represented by the equivalent circuit shown in FIG. 2b, the interstage network is shown circuited and the noise of the second stage is represented by an equivalent current generator $i'_{d1}$ at the output of that stage. If $i_{out}$ is the short circuit noise current in the output of the first tetrode half, the following relationships exist:

$$\overline{i^2_{out\,1}}=\frac{|Y_{m1}-j\omega C_{dg}|^2}{|Y_s+Y_{gs1}+j\omega C_{dg}|^2}\left[\overline{i_s^2}+\overline{1''^2_{g1}}+\overline{\left|i'_{g1}+i_{d1}\left(\frac{Y_s+Y_{gs1}+j\omega C_{dg}}{Y_{m1}-j\omega C_{dg}}\right)\right|^2}+\overline{i'^2_{d1}}\frac{|Y_s+Y_{gs1}+j\omega C_{dg}|^2}{|Y_{m1}-j\omega C_{dg}|^2}\right]$$

Substitution of the following $Y_s=g_s+jb_s$; $Y_{gs1}=g_{gs1}j\omega C$;

$$\overline{i_s^2}=4kTg_s\Delta f;\ \overline{i''^2_{g1}}=4kTg_{n1}\Delta f\cdot$$

$$\overline{i_{d1}^2}=4kTR_{n1}\Delta f|Y_{m1}-j\omega C_{dg}|^2;$$

$$\overline{i'^2_{d1}}=4kTR'_{n1}\Delta f|Y_{m1}-j\omega C_{dg}|^2$$

$$Y_{cor1}=\frac{i'_{g1}}{i_{d1}}(Y_{m1}-j\omega C_{dg})=\frac{\overline{i_{g1}i^*_{d1}}}{\overline{i_d^2}}(Y_{m1}-j\omega C_{dg})$$

results in the following expression for the noise figure F:

$$F=1+\frac{g_{n1}}{g_s}+\frac{R_{n1}}{g_s}|Y_s+Y_{gs1}+j\omega C_{dg}+Y_{cor1}|^2+\frac{R'_{n1}}{g_s}|Y_s+Y_{gs1}+j\omega C_{dg}|^2$$

Considered as a function of $b_s$, this has a minimum value between $b_{s1}=-(C_{gs1}+C_{dg}+aC_{cor1})$ and $b'_s=-(C_{gs1}+C_{dg})$, which is quite close to the tuning for maximum signal transfer. The tuned noise figure is therefore $$F_{tuned}=1+\frac{g_{n1}}{g_s}+\frac{R_{n1}}{g_s}(g_s+g_{gs1}+g_{cor1})^2+\frac{R'_{n1}}{g_s}(g_s+g_{gs1})^2$$

$$\simeq 1+\frac{g_{n1}}{g_s}+\frac{(R_{n1}+R'_{n1})}{g_s}(g_s+g_{gs1})^2$$

as long as $g_{cor1}$ is not too large. In that case the only effect of the second half is to increase the noise figure $R_n=R_{n1}+RA:_{n1}$ of the assembly.

The second step is to calculate $R'_{n1}$. To do so, it is necessary to evaluate the output admittance $Y_{out}$ of the first half of the tetrode. If an emf $v$ is applied to the short-circuited output (FIG. 2b) the resulting current is seen to be $i=Y_{out}v=Y_{m1}v_{g1}+j\omega Cdg(v-v_{g1})$ It can be seen that $$v_{g1}=v\frac{j\omega C_{dg}}{Y_s+Y_{gs1}+j\omega C_{dg}}$$

so that $$Y_{out}=j\omega C_{dg}\frac{Y_{m1}+Y_s+Y_{gs1}}{j\omega C_{dg}+Y_s+Y_{gs1}}$$

Figure 2C:
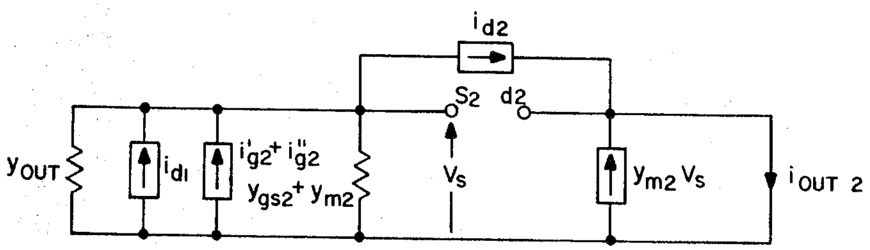
FIG. 2*c* is the equivalent circuit shown in FIG. 2*a;*

If the first half of the tetrode FET is replaced by $Y_{out}$, while retaining the short circuit drain noise $i_{d1}$ of that half, it is possible to calculate $i'_{d1}$. The equivalent current of the half is then as shown in FIG. 2c. The current in the short-circuited output of the second half is $$i_{out2}=(i_{d1}+i_{g2}'+i_{g2}'')\frac{Y_{m2}}{Y_{m2}+Y_{gs2}+Y_{out}}+i_{d2}\left(-\frac{Y_{m2}}{Y_{m2}+Y_{gs2}+Y_{out}}+1\right)=\frac{Y_{m2}}{Y_{m2}+Y_{gs2}+Y_{out}}(i_{d1}+i_{d1}')$$

so that $$i_{d1}'=(i_{g2}'+i_{g2}'')+i_{d2}\cdot\frac{Y_{gs2}+Y_{out}}{Y_{m2}}$$

and hence $$\overline{i'^2_{d1}}=4kTR_{n1}'\Delta f|Y_{m1}-j\omega C_{dg}|^2=\overline{i''^2_{g2}}+\frac{\overline{i_{d2}^2}}{|Y_{m2}|}\left|\frac{i_{g2}'Y_{m2}}{i_{d2}}+Y_{oun}+Y_{gs2}\right|^2=4kT\Delta f[g_{n2}+R_{n2}|Y_{out}+Y_{gs2}+Y_{cor2}|^2]$$

where $$\overline{i''^2_{g2}}=4kTg_{n2}\Delta f;\ \overline{i_{d2}^2}=4kTR_{n2}\Delta f|Y_{m2}|^2;$$

$$Y_{cor2}=\frac{i_{g2}'}{i_{d2}}Y_{m2}$$

so that $$R'_{n1}=\frac{g_{n2}+R_{n2}|Y_{out}+Y_{gs2}+Y_{cor2}|^2}{|Y_{m1}-j\omega C_{dg}|^2}$$

Often $Y_{cor2}$ will be so small that its effect can be neglected.

At relatively low frequencies $\omega C_{dg}<<|Y_{m1}|$, $|Y_{out}+Y_{gs2}|<<|Y_{m1}|$ $g_{n2}<|Y_{m1}|$ In such cases $R'_{n1}$ is negligible in comparison with $R_{n1}$ and the noise figure of the tetrode corresponds to the noise figure of the first half. Near the cutoff frequency $f_o$ of the transistor circuit, however, $R'_{n1}$ can be comparable to or larger than $R_{n1}$, so that the effect of the second stage must be taken into account.

Finally, if the tetrode is provided with five external leads $g_1$, $s_1$, $d_1=s_2$, $g_2$ and $d_2$, it is possible to neutralize the capacitance $C_{dg}$ by tuning and to tune the interstage network.

Considering the first effect, since $Y_{m1}=g_{m1}/(1+jf/f_o)$, $|Y_{m1}-j\omega C_{dg}|>|Y_{m1}|$ it would appear that the capacitance $C_{dg}$ would have a beneficial effect on both $R_{n1}$ and $R'_{n1}$. However, this overlooks the effect of $Y_{out}$ on $R'_{n1}$. Near the cutoff frequency $Y_{out}$ becomes quite large and this has the tendency to increase $R'_{n1}$ considerably. In most cases the latter effect will predominate, and hence elimination of $C_{dg}$ by neutralization (=tuning) has a beneficial effect.

Further improvement is obtained by tuning the interstage network to the center frequency of the pass band. In that case $|Y_{out}+Y_{gs2}+Y_{cor2}|^2$ must be replaced by $g_{gs2}$, and the expression for $R'_{n1}$ becomes $$R'_{n1}=\frac{g_{n2}+R_{n2}g^2_{gs2}}{|Y_{m1}|^2}$$

Figure 3:
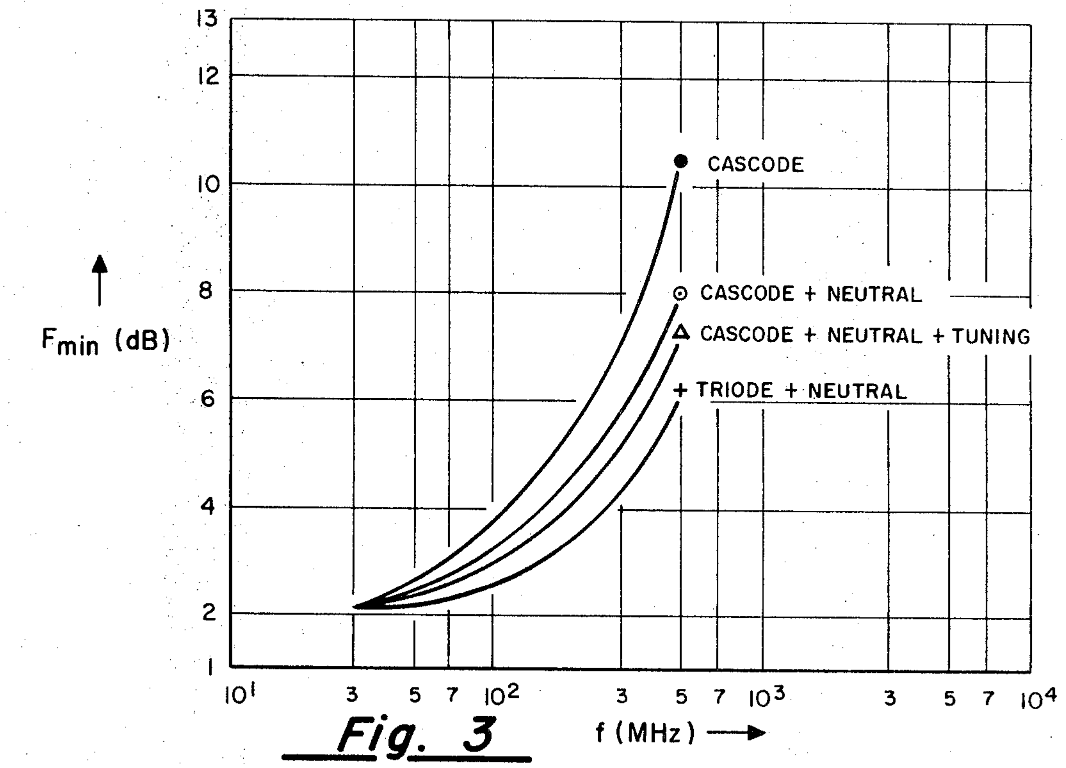
FIG. 3 is a plot of the noise figures versus frequency for the cascode circuit, the cascode circuit with neutralization of the first portion of the circuit, the cascode circuit with neutralization and with tuning of the interstage between first and second halves of the circuit, and the field effect transistor triode with neutralization.

Analysis of the noise figure was performed in an FET cascode circuit using junction FET's available commercially. FIG. 3 shows the noise figure $F$ as a function of frequency for a neutralized single stage FET, identified as +; for an unneutralized cascode circuit identified as⊙; for a cascode circuit with neutralized first half identified ⊙ ; and for a cascode circuit with neutralized first half and with a tuned interstage network between the first and second half identified as Δ.

While the tetrode FET, even under the best conditions, has a higher noise figure than the neutralized single stage circuit, it is seen that considerable improvement in noise figure is obtainable by neutralizing the first half of the cascode circuit. Further improvement in noise figure is possible by tuning the interstage network between the first and second half of the cascode circuit. The improvement is most pronounced at the highest frequencies and relatively small at lower frequencies.

Figure 4:
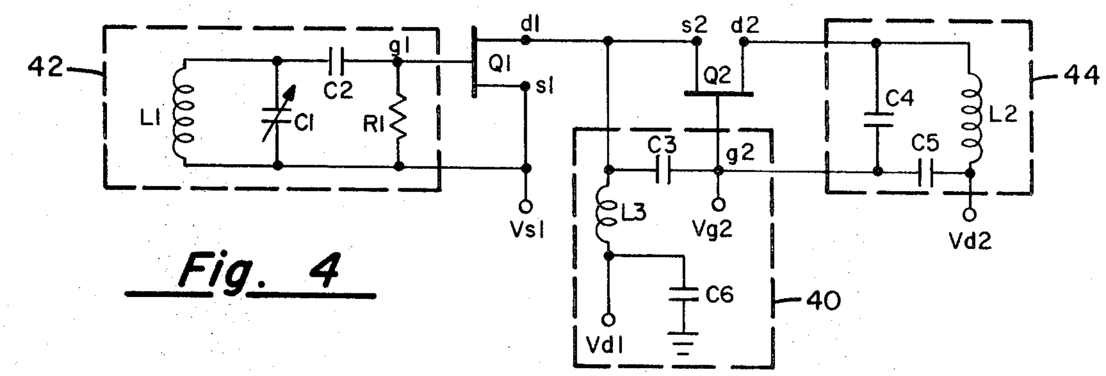
FIG. 4 is a circuit schematic diagram illustrating interstage tuning.

FIG. 4 is a circuit schematic which illustrates the use of the common terminal between point *d1* and *s2* for accomplishing the interstage tuning of the two halves of the circuit. In this arrangement, there is an input circuit shown enclosed within dashed block 42, comprised of coil L1, capacitor C1, capacitor C2, and resistor R1, all coupled to the *g1* of the first half Q1 of the circuit. Source terminal *s1* is adapted for coupling to a power supply V*s1*. The second half of the circuit is referred to as Q2 and has the drain terminal *d2* coupled to the output circuit, shown enclosed within dashed block 44, and comprised of coil L2, capacitor C4 and C5. The output circuit is arranged to be coupled to a voltage source V*d2*. The interstage tuning circuitry is shown within dashed block 40 and is comprised of elements coupled to the gate terminal *g2* and to the common terminal between drain *d1* and source *s2*. Coil L3 is coupled to this common point and to one electrode of capacitor C3, with the other electrode of capacitor C3 being coupled to the gate terminal *g2*. Gate terminal *g2* is also arranged for coupling to a voltage source V*g2*. The other terminal of coil L3 is coupled to terminal voltage source V*d1* at one terminal of capacitor C6, which has its other terminal grounded. The circuit components values for capacitors C3 and C6 and coil L3 are selected for tuning the interstage network to the center frequency of the pass band.

Figure 5:
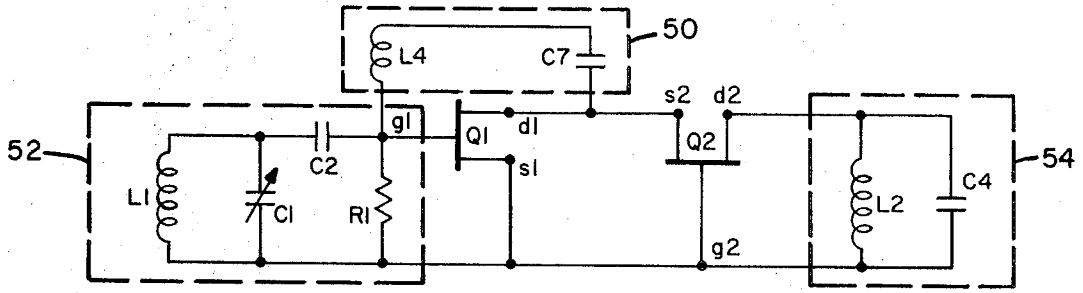
FIG. 5 is a circuit schematic illustrating neutralization of the first drain-to-first gate capacitance.

Next turning attention to FIG. 5, which is a schematic diagram representative of the cascode circuit arrangement and the tetrode field effect transistor circuit arrangement, there is illustrated the circuitry within dashed block 50 that operates to neutralize the effect of the capacitance $C_{dg}$ in the gate$_1$-to-drain$_1$ circuit. It can be seen that capacitor C7 has one terminal coupled to the common point between drain *d1* and source *s2* with its other terminal coupled to coil L4. The other terminal of coil L4 is coupled to the terminal for gate$_1$ referred to as *g1*. Again, the input circuit is shown enclosed within dashed block 52 and the output circuit is shown enclosed within dashed block 54. The selection of the component values L4 and C7 will be made to essentially eliminate the factor of the capacitance $C_{dg}$. Of course the terminals *s1*, *g2* and *d2* will be provided with the appropriate operating voltages (not shown).

It is clear that the interstage tuning means 40 of FIG. 4 can be combined in the same circuit as the capacitance neutralization means 50 shown in FIG. 5, thereby gaining the total effect illustrated for this combination in FIG. 3 and providing the minimum noise figure for the circuit.

CONCLUSION

In view of the foregoing detailed description of the invention when viewed in light of the drawings, it is clear that an improved field effect transistor circuit is provided by the addition of the fifth output terminal coupling to the common point of drain$_1$ and source$_2$. Further, an enhanced circuit operation results from the addition of the interstage tuning circuitry either alone, or in combination with the neutralizing circuitry. It will be apparent that various interstage tuning and neutralization circuit arrangements will result in an improved noise figure for the total circuit.

Having, therefore, fully described the invention, and recognizing that various changes and modifications will become apparent to those skilled in the art, while remaining within the spirit and scope of the invention, what is intended to be protected by Letters Patent is set forth in the appended claims.

We claim:

1. An improved field effect transistor circuit comprising first half-circuit and second half-circuit means arranged on tetrode field effect semiconductor translating means disposed on a common semiconductor substrate, said first half-circuit means having a first source terminal means, a first gate terminal means, and a first drain means; said second half-circuit means having second source means coupled directly to and in common with said first drain means, second gate terminal means, and second drain terminal means; tuning terminal means coupled to said common first drain means second source means; and interstage tuning means coupled to said tuning terminal means and said second half-circuit means for tuning said first half-circuit means to said second half-circuit means for improving the noise figure of said circuit.

2. A circuit as in claim 1 wherein said first and second half-circuit means comprise a cascode circuit arrangement.

3. An improved field effect transistor circuit comprising first half-circuit and second half-circuit means arranged on tetrode field effect semiconductor translating means disposed on a common semiconductor substrate, said first half-circuit means having a first source terminal means, a first gate terminal means, and a first drain means; said second half-circuit means having second source means coupled directly to and in common with said first drain means, second gate terminal means, and second drain terminal means; tuning terminal means coupled to said common first drain means and second source means; and capacitance neutralization means coupled to said tuning terminal means and said first half-circuit means for neutralizing the effects of capacitance between said first gate terminal means and said first drain means for improving the noise figure of said circuit.

4. A circuit as in claim 3 and further including interstage tuning means coupled to said tuning terminal means and said second half-circuit means for tuning said first half-circuit means to said second half-circuit means for further improving the noise figure of said circuit.

5. A circuit as in claim 4 wherein said first and second half-circuit means comprise a cascode circuit arrangement.

PO-1050
(5/69)

UNITED STATES PATENT OFFICE
CERTIFICATE OF CORRECTION

Patent No. 3,586,887 Dated June 22, 1971

Inventor(s) Aldert Van der Ziel et al

It is certified that error appears in the above-identified patent and that said Letters Patent are hereby corrected as shown below:

Column 1, line 39, "cascade" should be --cascode--.

Column 2, line 16, after "circuit" --of the output portion of the equivalent circuit-- is omitted.

Column 3, line 18, "tow" should be --two--.

Column 3, line 20, "shown" should be --short--.

Column 3, line 35, preceding "$j\omega C$, --+-- is omitted.

Column 3, line 51, preceding "Ys", vertical bar is omitted.

Column 3, line 55, preceding "$C_{corl}$", "a" should be omitted.

Column 3, line 70, "+RA:" should be --+R'--.

Column 3, line 74, "Ymi" should be --Yml--.

Column 4, line 34, "$Y_{oun}$" should be --$Y_{out}$--.

Column 4, line 64, "on" should be standard type instead of script.

Column 5, line 5, "$\ominus$" should be --$\bullet$--.

Column 6, line 30, after "means" (second occurrence), --and-- is omitted.

Signed and sealed this 14th day of December 1971.

(SEAL)
Attest:

EDWARD M.FLETCHER,JR.
Attesting Officer

ROBERT GOTTSCHALK
Acting Commissioner of Patents